(12) United States Patent
Yamasaki

(10) Patent No.: US 7,952,094 B2
(45) Date of Patent: May 31, 2011

(54) ELECTRO-OPTICAL DEVICE, METHOD OF MANUFACTURING ELECTRO-OPTICAL DEVICE, AND ELECTRONIC APPARATUS

(75) Inventor: Yasuji Yamasaki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 436 days.

(21) Appl. No.: 11/401,338

(22) Filed: Apr. 10, 2006

(65) Prior Publication Data

US 2006/0226427 A1 Oct. 12, 2006

(30) Foreign Application Priority Data

Apr. 11, 2005 (JP) .................................. 2005-113145
Feb. 9, 2006 (JP) .................................. 2006-031982

(51) Int. Cl.
*H01L 29/04* (2006.01)
(52) U.S. Cl. .................................. 257/59; 257/E27.113
(58) Field of Classification Search ............. 257/59, 257/72, E27.113, 71; 349/49
See application file for complete search history.

(56) References Cited

U.S. PATENT DOCUMENTS

| | | | |
|---|---|---|---|
| 6,597,413 B2 | 7/2003 | Kurashina | |
| 6,636,284 B2 | 10/2003 | Sato | |
| 7,163,848 B2 | 1/2007 | Yamazaki et al. | |
| 7,193,663 B2 | 3/2007 | Shimizu et al. | |
| 7,253,795 B2 | 8/2007 | Tsunekawa et al. | |
| 7,301,599 B2 | 11/2007 | Choi et al. | |
| 2001/0048109 A1* | 12/2001 | Murade | 257/72 |
| 2002/0024622 A1* | 2/2002 | Murade | 349/44 |
| 2002/0060756 A1* | 5/2002 | Kurashina | 349/39 |
| 2004/0145541 A1* | 7/2004 | Iki et al. | 345/44 |
| 2007/0102713 A1 | 5/2007 | Yamazaki et al. | |

FOREIGN PATENT DOCUMENTS

| | | |
|---|---|---|
| CN | 1366652 | 8/2002 |
| CN | 1499274 | 5/2004 |
| JP | 06-003703 A | 1/1994 |
| JP | 07-049508 A | 2/1995 |
| JP | 2000-091585 A | 3/2000 |
| JP | 2001-147447 A | 5/2001 |
| JP | 2001-281684 A | 10/2001 |
| JP | 2002-094078 A | 3/2002 |
| JP | 2002-149089 A | 5/2002 |
| JP | 2002-156652 A | 5/2002 |
| JP | 2004-170908 A | 6/2004 |
| JP | 2005-062418 A | 3/2005 |
| TW | 200411284 A | 12/1992 |

* cited by examiner

*Primary Examiner* — Wael M Fahmy
*Assistant Examiner* — Sarah K Salerno
(74) *Attorney, Agent, or Firm* — AdvantEdge Law Group, LLC

(57) ABSTRACT

An electro-optical device including a substrate, data lines and scanning lines, thin film transistors being disposed below the data lines and above the substrate. Storage capacitors are disposed over the data lines in a region opposite to the channel region of the thin film transistors in plan view. Each storage capacitor has a pixel-potential-side electrode, a dielectric film, and a fixed-potential-side electrode that have been formed sequentially. The pixel electrodes are disposed over the storage capacitors so as to correspond to the data lines and the scanning lines on the substrate in plan view, and the pixel electrodes are electrically connected to the pixel-potential-side electrodes and the thin film transistors. This abstract is intended only to aid those searching patents, and is not intended to be used to interpret or limit the scope or meaning of the claims in any manner.

13 Claims, 13 Drawing Sheets

ELECTRO-OPTICAL DEVICE, METHOD OF MANUFACTURING ELECTRO-OPTICAL DEVICE, AND ELECTRONIC APPARATUS

RELATED APPLICATION INFORMATION

The present application claims priority from Japanese Patent Application No. 2005-113145, filed on Apr. 11, 2005, and Japanese Patent Application No. 2006-031982, filed on Feb. 9, 2006, the entire contents of which are hereby incorporated by reference.

BACKGROUND

1. Technical Field

The present invention relates to an electro-optical device such as a liquid crystal device, to a method of manufacturing the electro-optical device, and to an electronic apparatus such as a liquid crystal projector.

2. Related Art

In general, an electro-optical device includes pixel electrodes, scanning lines for selectively driving the pixel electrodes, data lines, and TFTs (thin film transistors) serving as pixel switching elements, all of which are provided on a substrate, and can be driven by an active matrix drive manner. Further, in order to improve contrast, a storage capacitor may be provided between the TFT and the pixel electrode. The above-mentioned elements are provided on the substrate in high density, which improves the aperture ratio of the pixel and reduces the size of the device (for example, see JP-A-2002-156652).

Recently, electro-optical devices have been required to have further improved display quality and to have a smaller size and higher definition. In response to the requirements, various measures including the above-mentioned measures have been taken. For example, a light-shielding layer may be provided around a semiconductor layer of a TFT in order to prevent display quality from deteriorating due to light leak current caused by light incident on the semiconductor layer. Further, it is preferable for the storage capacitor to have capacitance as large as possible and to be designed so as not to sacrifice the aperture ratio of the pixel. Furthermore, it is preferable for these many circuit elements to be provided on the substrate in a high density so as to reduce the size of the device.

Meanwhile, the shape or manufacturing method of an electronic element such as a storage capacitor of such an electro-optical device has been devised and various techniques has been proposed to improve the device performance and the production yield (for example, see JP-A-6-3703 and JP-A-7-49508).

However, in the various techniques according to the related art, as the functionality or the performance improves, the laminated structure on the substrate becomes complicated. This makes the manufacturing method more complicated and thus reduces the production yield. In contrast, when the laminated structure on the substrate or the manufacturing process is simplified, the display quality may deteriorate due to degradation in its light-shielding performance, and in particular, the deterioration of the image signal caused by parasitic capacitance existing in the pixel electrode and the lower layer thereof.

SUMMARY

An advantage of one aspect of the invention is that it provides an electro-optical device, with a simplified laminated structure or manufacturing process, while achieving a high-quality display, as well as a method of manufacturing the electro-optical device and an electronic apparatus having the electro-optical device.

According to a one exemplary embodiment of the invention, an electro-optical device includes: a substrate; data lines and scanning lines that extend on the substrate so as to cross each other; thin film transistors that are disposed below the data lines on the substrate; storage capacitors each of which is disposed over the data line in a region including a region opposite to a channel region of the thin film transistor on the substrate in plan view, and includes a pixel-potential-side electrode, a dielectric film, and a fixed-potential-side electrode that are sequentially laminated from the bottom; and pixel electrodes that are disposed over the storage capacitors in every pixel provided so as to correspond to the data lines and the scanning lines on the substrate in plan view, and are electrically connected to the pixel-potential-side electrodes and the thin film transistors. Further, at least one of the fixed-potential-side electrode and the pixel-potential-side electrode has a first conductive light-shielding film.

The electro-optical device can be driven in an active matrix manner by applying data signals from the data lines to pixel electrodes of pixels having TFTs selected by the scanning lines at the time of operation. The storage capacitor improves the potential-retaining properties of the pixel electrode, which improves the contrast of the display.

In the electro-optical device according to the first embodiment of the invention, the storage capacitor, disposed over the data lines in a region including a region opposite to a channel region, has a first conductive light-shielding film in at least one of the fixed-potential-side electrode and the pixel-potential-side electrode. Therefore, the storage capacitor can be disposed on the data line with an interlayer insulating film provided therebetween so as to be close to the channel region, and thus shield the channel region of the TFT from incident light from an upper layer. As a result, at the time of the above-mentioned operation, light leak current in the TFT is reduced, whereby the contrast ratio can be reduced and a high-quality display can be achieved.

The pixel electrodes are disposed over the storage capacitors in every pixel. The pixel electrode is disposed over the fixed-potential-side electrode of the storage capacitor with the interlayer insulating film provided therebetween and therefore a potential of a conductive film immediately below the pixel electrode is fixed. Here, the term "fixed potential" means a potential fixed for at least a predetermined period regardless of the contents of the image data. For example, as a ground potential, the fixed potential may be a constant potential completely fixed in regard to a time axis. Alternately, in another exemplary embodiment of the invention, as a common electrode potential or a counter electrode potential, the fixed potential may be a potential fixed for a predetermined period in regard to a time axis. For example, the fixed potential may be a potential that is fixed to a first fixed potential for odd-numbered field periods and to a second fixed potential for even-numbered field periods. Therefore, even though the storage capacitor is disposed on the substrate in plan view so as to be close to an adjacent pixel electrode or to partially overlap the adjacent pixel electrode, it is possible to prevent electrical interference, that is, electrical coupling from occurring between the adjacent pixel electrode and the pixel-potential-side electrode. Even though the potentials of the adjacent pixel electrode and the pixel-potential-side electrode are different from each other, it is possible to block the electrical effects on each other because the fixed-potential-side electrode exists between the adjacent pixel electrode and the pixel-potential-side electrode. Therefore, it is possible to prevent electrical interference from occurring between the adjacent pixel electrode and the pixel-potential-side electrode, that is, between the pixel electrodes adjacent to each other. As a result, it is possible to improve the contrast ratio and to achieve a high-quality display.

Further, the light-shielding effect and the electrical interference blocking effect can be achieved by a simplified construction in which the TFTs, the data lines, the storage capacitors, and the pixel electrodes are laminated on the substrate in the order with the interlayer insulating films therebetween.

Consequently, it is possible to simultaneously simplify the laminated structure on the substrate and achieve a high quality display, as the light leak current and the adverse effects due to the electrical interference between the pixel electrodes can be reduced by the existence of the storage capacitor. Further, the simplification of the laminated structure on the substrate leads to simplification of the manufacturing process and improvement of the yield.

In accordance with another exemplary embodiment of the invention, the thin film transistors are disposed so as to correspond to the intersections of the data lines and the scanning lines on the substrate in plan view such that at least portions of the channel regions are covered with the data lines, and each of the data lines has a second conductive light-shielding film.

According to this embodiment, the channel region of the thin film transistor is at least partially covered by the data line disposed thereon, and the data line includes the second conductive light-shielding film. Therefore, it is possible to more reliably shield the channel region of the thin film transistor from incident light from the upper layer by the data line that can be disposed close to the channel region. As a result, at the time of the operation, it is possible to reduce the light leak current in the thin film transistor and to improve the contrast ratio, thereby achieving a high-quality display.

In another exemplary embodiment of the invention, each of the scanning lines is disposed below the thin film transistor in a region including a region opposite to the channel region of the thin film transistor on the substrate in plan view and electrically connected to a gate of the thin film transistor through a contact hole, and includes a third conductive light-shielding film.

According to this embodiment, the scanning line is disposed below the thin film transistor so as to include the region opposite to the channel region, and has a third conductive light-shielding film. Therefore, the channel region can be shielded from return light, such as light reflected by the rear surface of the substrate or light that is emitted from another electro-optical device and passes through a prism synthesis optical system in a double-plate projector, from the lower layer side by the scanning lines. As a result, the channel region of the thin film transistor can be reliably shielded from both of incident from the upper layer side and return light from the lower layer side.

Further, the scanning line is electrically connected to the gate of the thin film transistor by the contact hole. Here, the term "contact hole" means a hole which passes through the interlayer insulating film in the thickness direction thereof in order to electrically connect the conductive layers, formed on the upper and lower sides of the interlayer insulating film, to each other. The contact hole may be a hole that is formed by caving in a part of the upper conductive layer so that it comes into contact with the lower conductive layer (that is, a contact hole), or a hole that is formed by burying a conductive material therein such that one end comes into contact with the upper conductive layer and the other end comes into contact with the lower conductive layer (that is, a hole formed as a plug).

In yet another exemplary embodiment of the invention, a planarized interlayer insulating film is laminated on at least one location among layers of the scanning line, the thin film transistor, the data line, the storage capacitor, and pixel electrode on the substrate.

According to this embodiment, the scanning lines, the thin film transistors, the data lines, the storage capacitors, and the pixel electrodes are laminated on the substrate with the interlayer insulating films provided therebetween. On the surface of the interlayer insulating film immediately after being laminated, unevenness occurs due to these elements in the lower layer. When the unevenness is removed by a planarizing process such as a chemical mechanical polishing (CMP) process, other polishing process, a spincoat process, a process of filling up concaves, or the like, the surface of the interlayer insulating film is planarized. When an electro-optical material such as liquid crystal is injected between the substrate having the above-mentioned construction and a counter substrate opposite thereto, since the substrate surface is flat, it is possible to reduce the possibility that declination in the alignment state of the electro-optical material occurs, thereby achieving a high-quality display. Further, even though it is preferable for such a planarizing process to be performed on all of the interlayer insulating films, even if the planarizing process is performed on a surface of any of the interlayer insulating films, the substrate surface is more flat as compared to when the planarizing process is not performed at all. Therefore, it is possible to reduce the possibility that declination in the alignment state of the electro-optical material occurs, thereby achieving a high-quality display.

In yet another exemplary embodiment of the invention, the dielectric film may be formed in a non-opening region positioned in a gap between opening regions of the respective pixels on the substrate in plan view.

According to this embodiment, the dielectric film is formed in the non-opening region. That is, in the opening region, the dielectric film may be hardly formed or may be not formed at all. Therefore, as for the dielectric film of the capacitor, it is unnecessary to consider the transmittance and a silicon oxide film having a high dielectric constant can be used.

In addition, the dielectric film can also function as a film for preventing water or moisture, thereby improving water resistance or moisture resistance.

In still another exemplary embodiment of the invention, the dielectric film is formed in a region excluding opening regions of the respective pixels on the substrate in plan view.

According this embodiment, the dielectric film is formed in a region excluding opening regions of individual pixels and is not formed in the opening regions of individual pixels. For this reason, even though the dielectric film is an opaque film, it dose not reduce the transmittance in the opening region. Therefore, as for the dielectric film of the capacitor, it is unnecessary to consider the transmittance and a silicon oxide film having a high dielectric constant can be used.

In addition, the dielectric film can function can also function as a film for preventing water or moisture, thereby improving water resistance or moisture resistance.

In still yet another exemplary embodiment of the invention, a conductive film having lower reflectivity than a conductive film constituting a main body of the data line is formed on the side of the data line opposite of the channel region.

According to this embodiment, the channel region can be shielded from return light, such as light reflected by the rear surface of the substrate or light that is emitted from another electro-optical device and passes through a prism synthesis optical system in a double-plate projector, in the surface of the data line opposite to the channel region, that is the lower surface of the data line. A film may be formed of a metal or a barrier metal, which has a reflectivity lower than that the Al film constituting the main body of the data line, on the surface of the data line opposite to the channel region, that is, the surface of the data line on the lower layer side.

In yet another exemplary embodiment of the invention, an edge of the pixel-potential-side electrode, which is opposite of at least the fixed-potential-side electrode with the dielectric film therebetween, has a tapered shape.

According to this embodiment, due to the taper shape, the gap between the pixel-potential-side electrode and the fixed-potential-side electrode in the vicinity of the edge is wider as compared to a case without the taper shape. Therefore, it is possible to reduce the possibility that both electrodes are short-circuited in the vicinity of the edge due to inferior manufacturing of the edge or a possibility that defects occur due to concentration of an electric field.

In yet another exemplary embodiment of the invention, the fixed-potential-side electrode may be formed in a region included in the region where the pixel-potential-side electrode is formed on the substrate in plan view.

According to this embodiment, since the fixed-potential-side electrode is not formed on the side opposite to the pixel-potential-side electrode with the dielectric film provided therebetween in the vicinity of the edge of the pixel-potential-side electrode, it is possible to reduce the possibility that both electrodes are short-circuited in the vicinity of the edge due to inferior manufacturing of the edge or a possibility that defects occur due to concentration of an electric field.

In yet another exemplary embodiment of the invention, the electro-optical device according to the first exemplary embodiment may further include a relay layer that is made of a conductive film in the same layer as the data line and performs a relay connection between the pixel-potential-side electrode and the drain of the thin film transistor.

According to this embodiment, the pixel-potential-side electrode and the drain of the thin film transistor are electrically connected to each other by the relay layer, that is, a relay connection is established therebetween. The pixel-potential-side electrode is connected to the relay layer by a contact hole passing through the interlayer insulating film provided therebetween, and the relay layer is connected to the thin film transistor by a contact hole passing through the interlayer insulating film provided therebetween. Therefore, it is possible to avoid a situation in which it is difficult to connect the pixel-potential-side electrode and the drain to each other by one contact hole due to a long distance therebetween. In particular, the data line and the relay layer may include conductive films in the same layer, which prevents the laminated structure and the manufacturing process from becoming complicated. Further, the relay layer may include a second conductive light-shielding film similar to the data line, and thus does not reduce the light-shielding performance.

In another exemplary embodiment, the fixed-potential-side electrode includes an extending portion that extends in the scanning-line direction and the pixel-potential-side electrode includes a protruding portion that protrudes beyond an edge of the fixed-potential-side electrode in the scanning-line direction. The pixel electrode may be electrically connected to the relay layer by a protruding portion of the pixel-potential-side electrode.

According to this embodiment, the pixel electrode and the relay layer are electrically connected to each other by the protruding portion of the pixel-potential-side electrode. In other words, the pixel electrode is connected to the protruding portion by a contact hole formed in the interlayer insulating film provided therebetween, and the protruding portion is connected to the relay layer by a contact hole formed in the interlayer insulating film provided therebetween. Therefore, it is possible to avoid a situation in which it is difficult to connect the pixel-potential-side electrode and the drain to each other by one contact hole due to a long distance therebetween. Further, the laminated structure and the manufacturing process are prevented from becoming complicated. The above-mentioned connection can be easily established by forming no fixed-potential-side electrode in the connection part between the protruding portion and the relay layer, for example, the part where the contact hole is formed.

According to yet another exemplary embodiment of the invention, an electronic apparatus is provided which includes the above-mentioned electro-optical device, making it possible to realize various electronic apparatuses capable of displaying high quality images, such as, for example, a television set, a mobile telephone, an electronic organizer, a word processor, viewfinder-type or monitor-direct-view-type video tape recorders, a work station, a video phone, a POS terminal, a touch panel, and an image forming apparatus, such as a printer using an electro-optical device as an head, a copier, and a facsimile. Further, the electronic apparatus of this embodiment of the invention invention can be realized as an electrophoretic apparatus such as an electronic paper, or a display device using an electron-emitting apparatus (a field emission display and a conduction electron-emitter display).

According to yet another exemplary embodiment of the invention, there is provided a method of manufacturing an electro-optical device, which includes a substrate; data lines and scanning lines extending on the substrate so as to cross each other; top-gate-type thin film transistors disposed below the data lines on the substrate; storage capacitors disposed over the data lines; and pixel electrodes disposed over the storage capacitors. The method comprises forming the thin film transistors in regions corresponding to the intersections of the data lines and the scanning lines on the substrate in plan view; forming the data lines over the thin film transistors; forming the storage capacitors over the data lines in a region including a region opposite to channel regions of the thin film transistors on the substrate in plan view such that a pixel-potential-side electrode, a dielectric film and the fixed-potential-side electrode are sequentially laminated, and at least one of the fixed-potential-side electrode and the pixel-potential-side electrode includes a first conductive light-shielding film; and forming the pixel electrodes on the storage capacitors in every pixel provided so as to correspond to the data lines and the scanning lines on the substrate in plan view such that the pixel electrodes are electrically connected to the thin film transistors and the pixel-potential-side electrodes.

According to the method of manufacturing an electro-optical device according to this embodiment of the invention, the laminated structure on the substrate is simplified, and it is possible to simplify the manufacturing process and to increase the yield.

In yet another exemplary embodiment of the invention, the forming of the storage capacitor includes forming a tapered portion at an edge of the pixel-potential-side electrode, which is opposite to at least the fixed-potential-side electrode with the dielectric film therebetween, by means of at least one of wet etching, plasma etching, and $O_2$ cleaning.

According to this embodiment, the tapered portion of the pixel-potential-side electrode can be relatively simply formed by at least one of wet etching, plasma etching, and $O_2$ cleaning. When the tapered portion is formed, it is possible to reduce the possibility that both electrodes are short-circuited in the vicinity of the edge due to inferior manufacturing of the edge or a possibility that defects occur due to concentration of an electric field. Further, in addition to forming a tapered portion, the method may include forming the fixed-potential-side electrode smaller than the pixel-potential-side electrode on the substrate in plan view.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, exemplary embodiments according to the invention will be described with reference to the drawings. In the exemplary embodiments below, a TFT active matrix driving type liquid crystal device with a built-in drive circuit will be used as an example of an electro-optical device.

First Exemplary Embodiment

A liquid crystal device according to a first exemplary embodiment of the invention will be described with reference to FIGS. 1 through 8.

Configuration of Electro-optical Device

First, referring to FIGS. 1 and 2, the configuration of the liquid crystal device according to the first exemplary embodiment will be described. Here, FIG. 1 is a plan view showing the configuration of the liquid crystal device according to the first exemplary embodiment and FIG. 2 is a cross-sectional view taken along the line II-II of FIG. 1.

Figure 1:
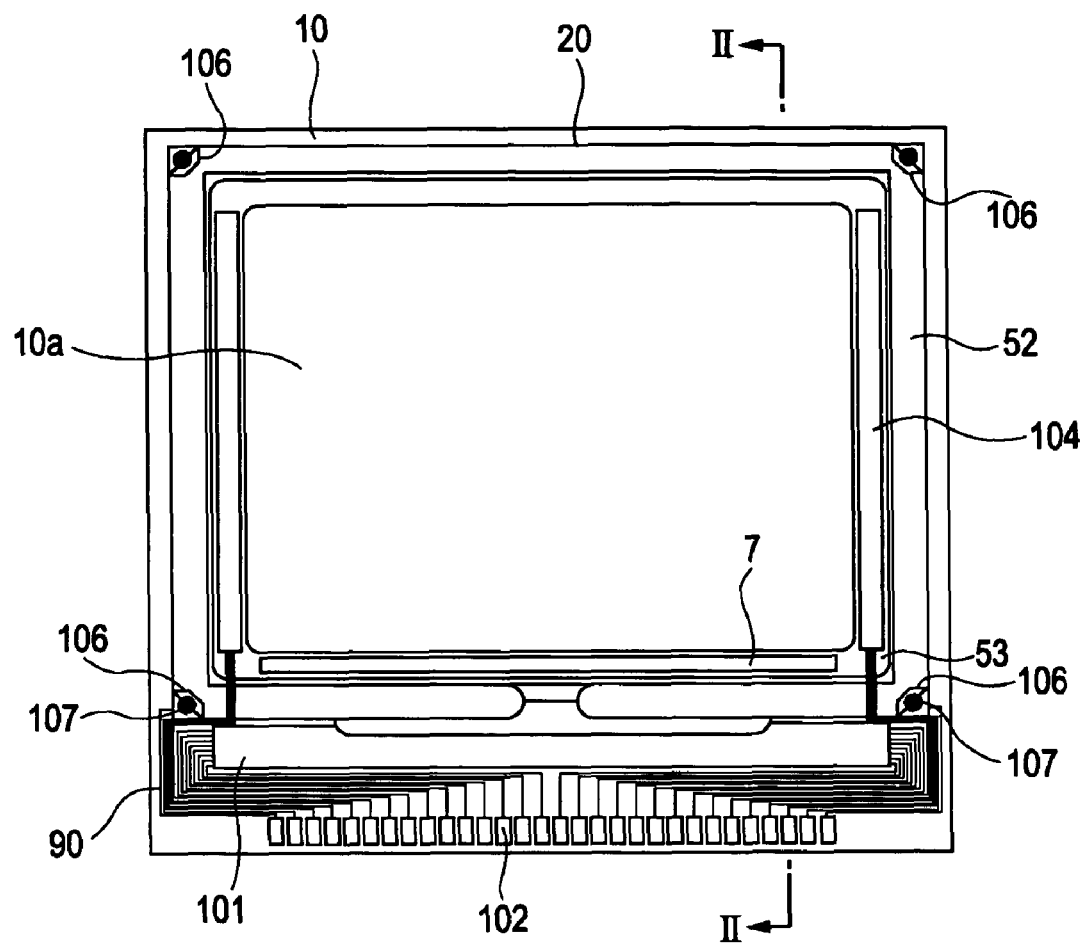
FIG. 1 is a plan view showing the construction of a liquid crystal device according to a first exemplary embodiment of the invention.
Figure 2:
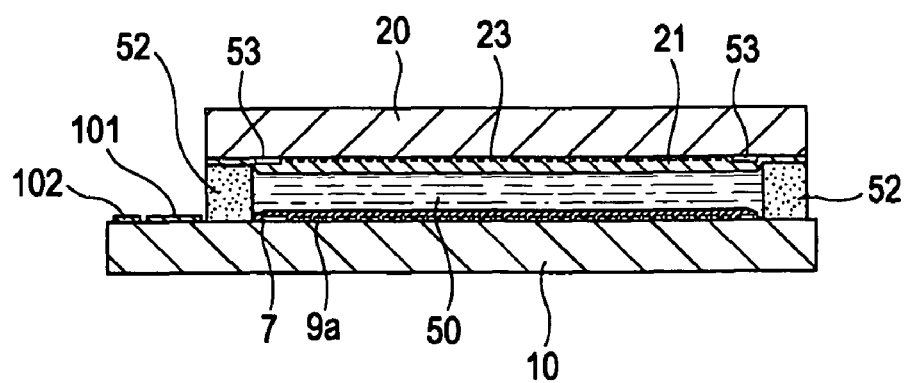
FIG. 2 is a cross-sectional view taken along the line II-II of FIG. 1.

In FIGS. 1 and 2, the liquid crystal device according to the first exemplary embodiment includes a TFT array substrate 10 and a counter substrate 20 opposite to each other. A liquid crystal layer 50 is sealed between the TFT array substrate 10 and the counter substrate 20. The TFT array substrate 10 and the counter substrate 20 are bonded to each other by a sealant 52 applied in a sealing region (to a sealing area) located in a peripheral area of an image display region 10a.

In FIG. 1, a frame light-shielding film 53 defining a frame region of the image display region 10a is provided on the side of the counter substrate 20 in parallel to the inner side of the sealing region where the sealant 52 is disposed. In the peripheral region positioned at the outer side of the sealing region where the sealing member 52 is disposed, a data line driving circuit 101 and an external circuit connection terminal 102 are provided along one side of the TFT array substrate 10. A sampling circuit 7 is provided on the inside of the sealing region along the one side so as to be covered by the frame light-shielding film 53. Further, scanning line driving circuits 104 are provided on the inside of the sealing region along two sides adjacent to the one side so as to be covered by the frame light-shielding film 53. Upper and lower conducting terminals 106 are disposed at four corners of the TFT array substrate 10 opposite to the counter substrate 20 so as to connect the two substrates to each other by upper and lower members 107. By these members, electrical connection is made between the TFT array substrate 10 and the counter substrate 20.

On the TFT array substrate 10, wiring lines 90 are formed so as to electrically connect an external circuit connecting terminal 102, a data line driving circuit 101, the scanning line driving circuits 104, the upper and lower connecting terminals 106, etc. to one anther.

In FIG. 2, on the TFT array substrate 10, a laminated structure is formed in which pixel switching TFTs (Thin Film Transistors) each serving as a driver element or wiring lines such as scanning lines and data lines are provided. In the image display region 10a, pixel electrodes 9a are provided at the upper layer of the pixel switching TFTs and the wiring lines such as the scanning lines, the data lines, etc. A light-shielding film 23 is formed on a surface of the counter substrate 20 opposite to the TFT array substrate 10. Further, on the light-shielding film 23, a counter electrode 21 is formed of a transparent material such as ITO so as to be opposite to the plurality of pixel electrodes 9a.

Also, on the TFT array substrate 10, in addition to the data line driving circuit 101 and the scanning line driving circuit 104, a test circuit, a test pattern, or the like for testing quality, defects, and so forth, of the liquid crystal device at the time of manufacturing or shipping may be formed.

Structure of Image Display Region

Figure 3:
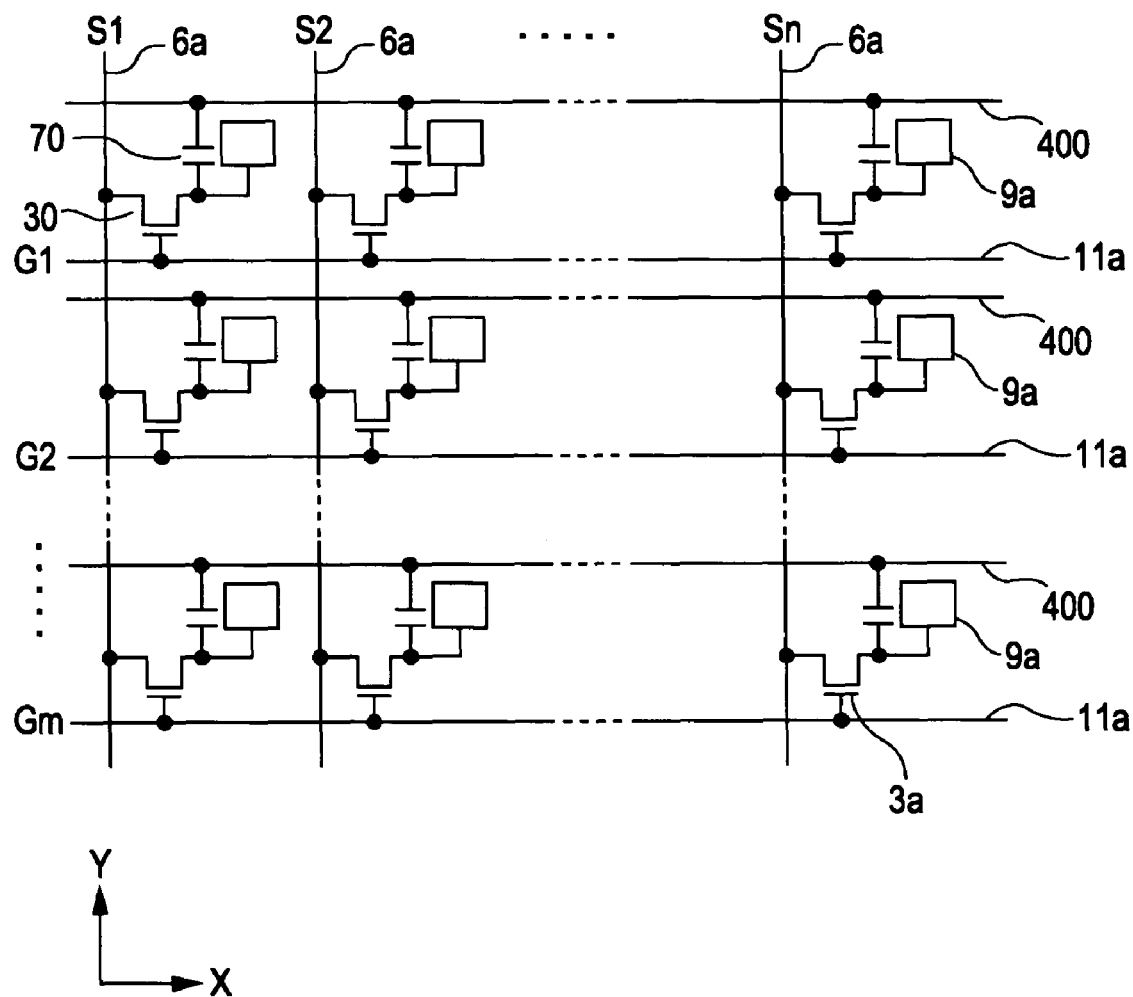
FIG. 3 is a circuit diagram of various elements, wiring lines, and the like in a plurality of pixels.
Figure 4:
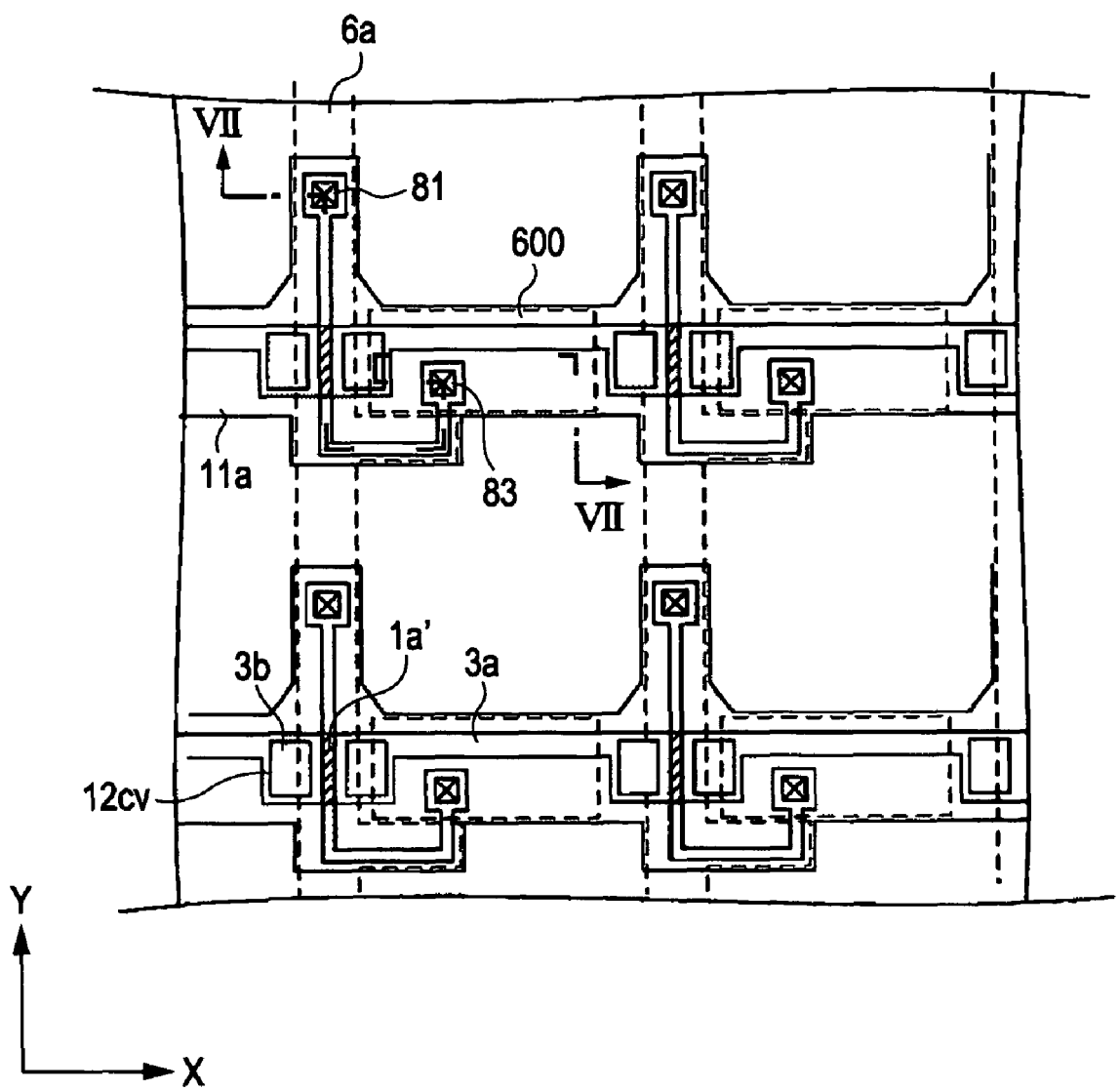
FIG. 4 is a plan view of a pixel group on the TFT array substrate according to the first exemplary embodiment and shows only the construction according to the lower part (corresponding to a part up to data lines (6a) in FIG. 7) of the pixel group.
Figure 5:
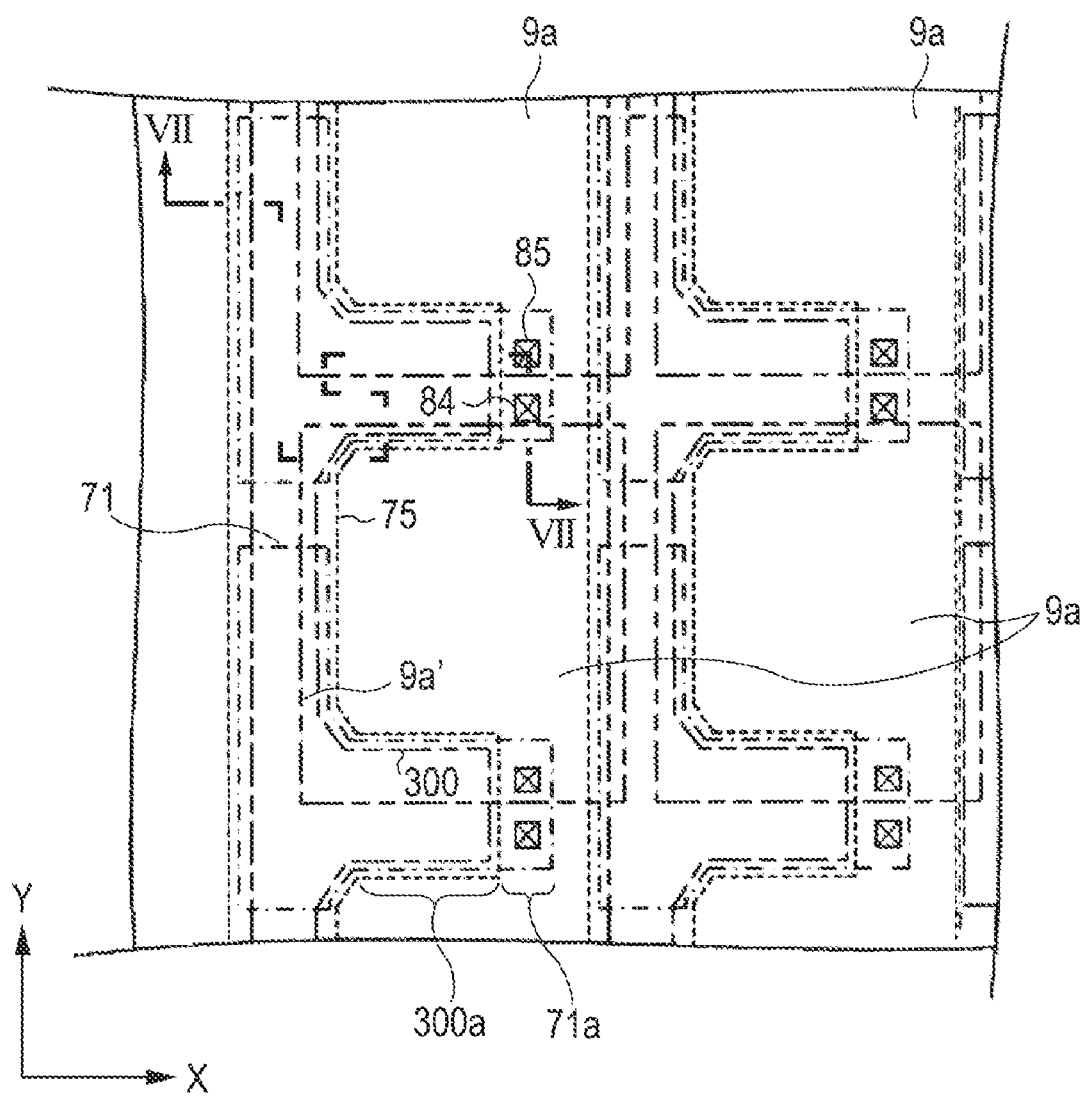
FIG. 5 is a plan view of the pixel group on the TFT array substrate according to the first exemplary embodiment and shows only the construction according to the upper part (corresponding to a part over data lines (6a) in FIG. 7) of the pixel group.
Figure 6:
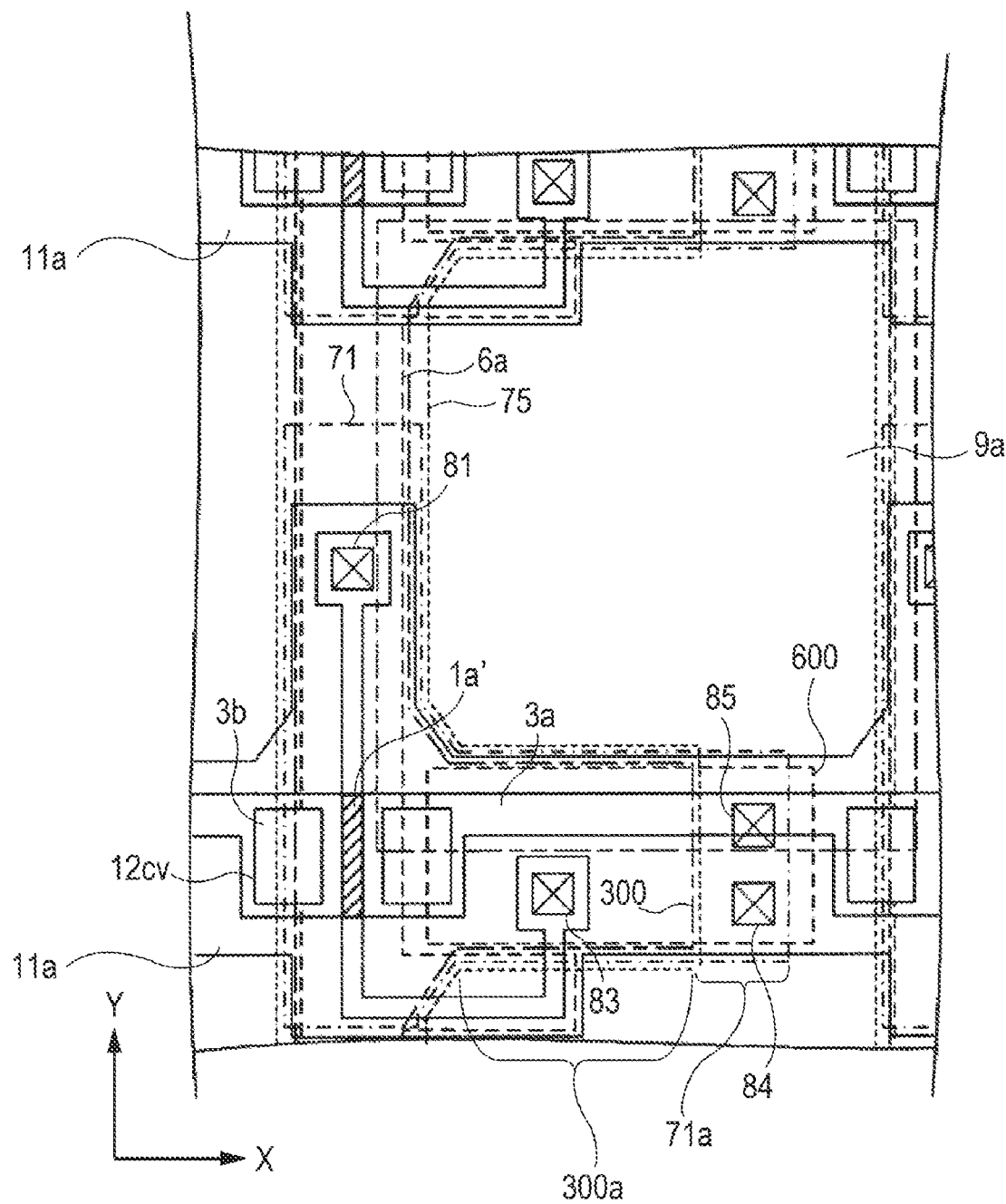
FIG. 6 is a partially enlarged plan view when the upper part of FIG. 5 is superimposed on the lower part of FIG. 4.
Figure 7:
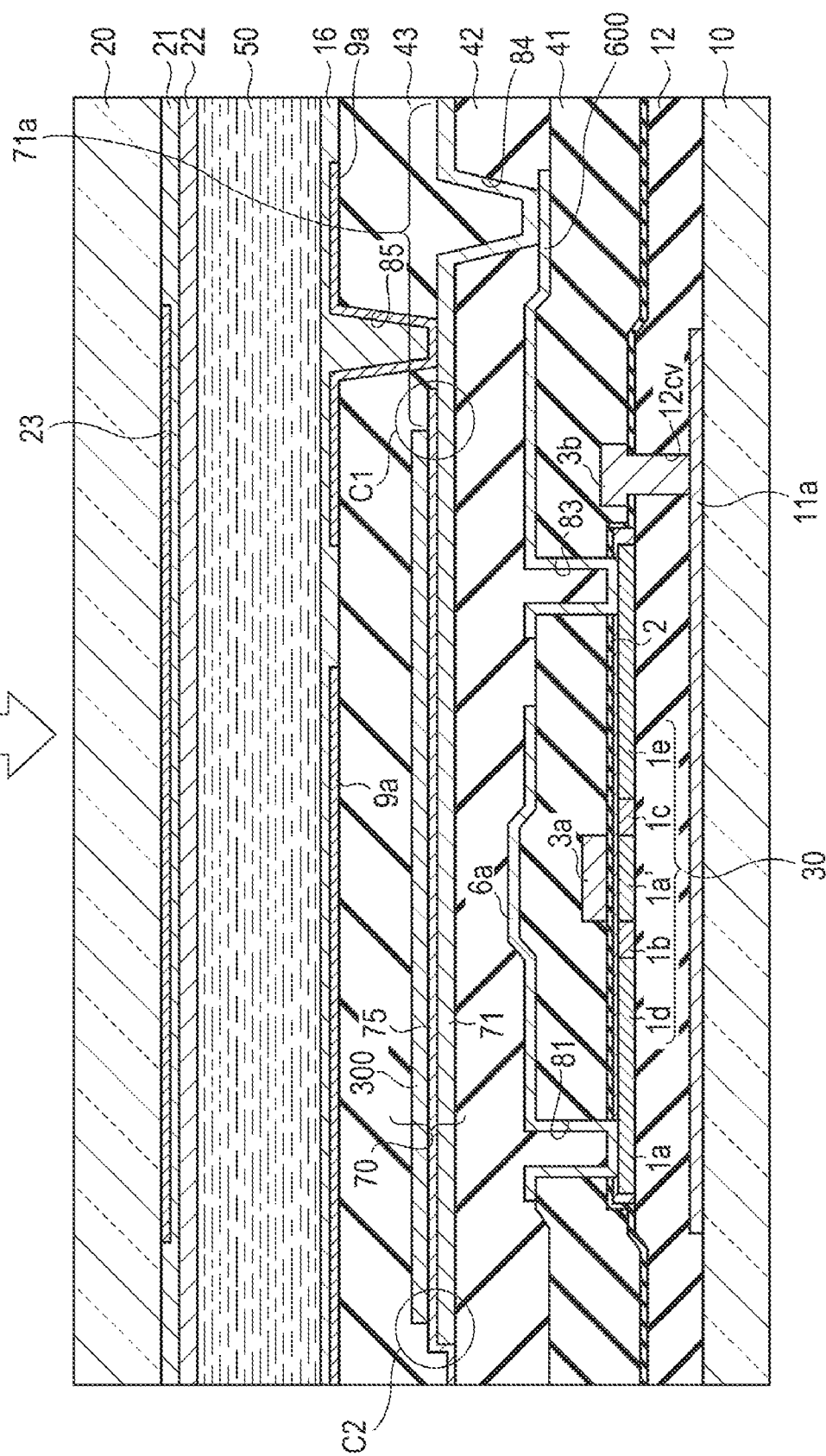
FIG. 7 is a cross-sectional view when the upper part of FIG. 5 is superimposed on the lower part of FIG. 4.
Figure 8:
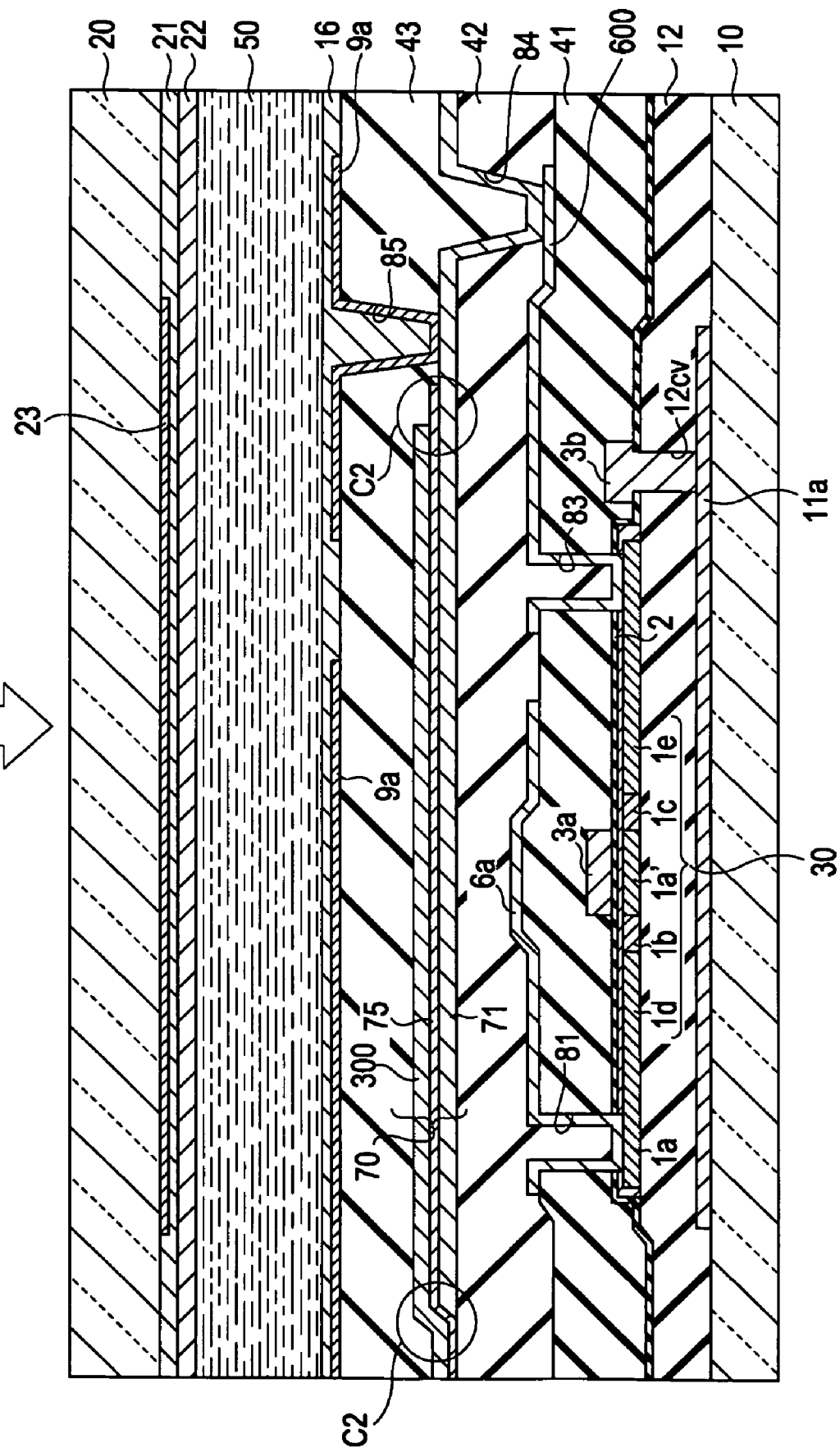
FIG. 8 is a cross-sectional view of a laminated structure in accordance with another exemplary embodiment of the invention.

Next, the construction of a pixel part of the liquid crystal device according to this exemplary embodiment will be described with reference to FIGS. 3 to 8. FIG. 3 is an equivalent circuit diagram of various kinds of elements, wiring lines, and so forth, in a plurality of pixels that are formed in a matrix and compose the image display region of the liquid crystal device. FIGS. 4 to 6 are plan views showing a partial construction in the pixel part on the TFT array substrate. FIG. 4 shows a lower layer part of the laminated structure to be described below, and FIG. 5 shows an upper layer part of the laminated structure. FIG. 6 is an enlarged plan view of the laminated structure in which FIGS. 4 and 5 overlap each other. FIG. 7 is a cross-sectional view of the laminated structure in which FIGS. 4 and 5 overlap each other, which is taken along the line VII-VII (shown in FIGS. 4 and 5). FIG. 8 is a cross-sectional view of a laminated structure in accordance with another embodiment of the invention. In FIGS. 7 and 8, scales of individual layers and members in the respective drawings are made different from each other so that the individual layers and members will have sizes capable of being recognized in the drawings.

Construction of Pixel Part

In FIG. 3, in each of the plurality of pixels, which are formed in a matrix and constitute the image display region of the liquid crystal device according to this exemplary embodiment, a pixel electrode 9a and a TFT 30 serving as a switch for controlling the pixel electrode 9a are formed, and a data line 6a supplied with an image signal is electrically connected to the source of the TFT 30. Image signals S1, S2, . . . , and Sn written into data lines 6a may be sequentially supplied in the order, or may be supplied to a plurality of data lines adjacent to one another as a group.

Further, a scanning line 11a is electrically connected to the gate of the TFT 30 and scanning signals G1, G2, . . . , and Gm are sequentially applied to the scanning lines hla in a pulse manner with a predetermined timing. Each pixel electrode 9a is electrically connected to the drain of each TFT 30, and the image signals S1, S2, . . . , and Sn supplied from the data lines 6a are written with predetermined timings by switching off the TFT 30, each serving as a switch element, for only a certain period.

The image signals S1, S2, . . . , and Sn of predetermined levels written in liquid crystal, which is an example of an electro-optical material, through the pixel electrodes 9a are held between the pixel electrodes and the counter electrode formed on the counter substrate for a certain period. In the liquid crystal, the alignment or order of the molecular association of the liquid crystal varies according to an applied voltage level such that light is modulated, thereby making a gray-scale display possible. A normally-white mode causes transmittance of incident light to be reduced depending on the voltage applied to each pixel, and a normally-black mode causes transmittance of incident light to be increased depending on the voltage applied to each pixel. Therefore, on the whole, the light having contrast that is dependent on an image signal is emitted from the liquid crystal device.

In order to prevent the image signals held between the pixel electrodes and the counter electrode from leaking, a storage capacitor 70 is added in parallel to a liquid crystal capacitor formed between the pixel electrodes 9a and the counter electrode. One electrode of the storage capacitor 70 is connected to the drain of the TFT 30 in parallel to the pixel electrode 9a, and the other electrode thereof is connected to a capacitor line 400 having a fixed potential so as to have a constant potential.

Next, an exemplary pixel part realizing the above-mentioned operation will be described with reference to FIGS. 4 to 8.

In FIGS. 4 to 8, individual circuit components of the pixel part are patterned so as to be constructed as a conductive film laminated on the TFT array substrate 10. The TFT array substrate 10 is composed of, for example, a glass substrate, a quartz substrate, a SOI substrate, a semiconductor substrate, etc., and is disposed to be opposite to the counter substrate 20 composed of, for example, a glass substrate or a quartz substrate. Further, each circuit component is composed of a first layer including the scanning lines hla, a second layer including the TFTs 30, a third layer including the data lines 6a, a fourth layer including the storage capacitors 70, and a fifth layer including the pixel electrodes 9a, sequentially formed from the bottom. Furthermore, a base insulating film 12, a first interlayer insulating film 41, a second interlayer insulating film 42, and a third interlayer insulating film 43 are provided between the first layer and the second layer, between the second layer and the third layer, between the third layer and the fourth layer, and between the fourth layer and the fifth layer, respectively, so as to prevent electric short between the respective components. Among the five layers, the first to third layers are shown in FIG. 4 as a lower layer part, and the fourth to fifth layers are shown in FIG. 5 as an upper layer part.

Construction of First Layer Including Scanning Line

The first layer includes the scanning lines 11a. The scanning lines hla are patterned into a shape in which a main line part extends along the X direction of FIG. 4 and protrusions extends along the Y direction of FIG. 4 where the data line 6a extends. As an example of "a third conductive light-shielding film" according to the invention, the scanning lines 11a can be formed of elemental metal, an alloy, metal silicide, polysilicide including at least one of the high-melting-point metals, such as titanium (Ti), chromium (Cr), tungsten (W), tantalum (Ta), and molybdenum (Mo), laminates thereof, or conductive polysilicon.

In this exemplary embodiment, the scanning lines 11a are disposed so as to contain a region opposite to a channel region 1a on the lower layer side of the TFTs 30, and are composed of a conductive film. Therefore, a channel region 1a' can be shielded, by the scanning lines 11a, from return light from the lower layer side, such as light reflected by the rear surface reflection of the TFT array substrate 10 or light that is emitted from a liquid crystal device and passes through a prism synthesis optical system in a double-plate projector using another liquid crystal device as a light valve.

Construction of Second Layer Including TFT

The second layer includes the TFTs 30. Each TFT 30 has, for example, an LDD (Lightly Doped Drain) structure and includes a gate electrode 3a, a semiconductor layer 1a, and an insulating film 2 including a gate insulating film insulating between the gate electrode 3a and the semiconductor layer 1a. The gate electrode 3a is formed of, for example, conductive polysilicon. The semiconductor layer 1a is formed of, for example, polysilicon, and includes the channel region 1a', a lightly doped source region 1b, a lightly doped drain region 1c, a heavily doped source region 1d, and a heavily doped drain region 1e. Further, while the TFT 30 preferably has an LDD structure, it may have an offset structure in which impurities are not injected to the lightly doped source region 1b and the lightly doped drain region 1c and may be a self-aligned type in which impurities are injected in high concentration by using the gate electrode 3a as a mask so as to form a heavily doped source region and a heavily doped drain region.

A part 3b of the gate electrode 3a of the TFT 30 is electrically connected to the scanning line 11a through a contact hole 12cv formed in the base insulating film 12. The base insulating film 12 is composed of, for example, a silicon oxide film, and has not only a function of insulating the first layer from the second layer but also a function of preventing the element characteristics of the TFT 30 from changing due to roughness or contaminant caused by polishing of the surface of the TFT array substrate when being formed on the entire surface of the TFT array substrate 10.

While the TFT 30 according to this exemplary embodiment has a top gate structure, in another embodiment, it may have a bottom gate type.

Construction of Third Layer Including Data Line

The third layer includes the data line 6a and the interlayer layer 600.

The data line 6a is an example of "the second conductive light-shielding film" according to the invention and is composed of three films, that is, an aluminum film, a titanium nitride film, and a silicon nitride film sequentially formed from the bottom. The data line 6a is formed so as to partially cover the channel region 1a' of the TFT 30. For this reason, the channel region 1a' of the TFT 30 can be shielded from incident light from the upper layer by the data line 6a that can be disposed close to the channel region 1a'. Further, the data line 6a is electrically connected to the heavily doped source region 1d of the TFT 30 through a contract hole 81 passing through the first interlayer insulating film 41.

In another exemplary embodiment of the invention, a conductive film having a reflectivity lower than that of a conductive film such as the Al film constituting the main body of the data line 6a may be formed on the side of the data line 6a opposite to the channel region 1a'. According to this embodiment, the above-mentioned return light is reflected by the surface of the data line 6a opposite to the channel region 1a', that is, the surface of the data line 6a on the lower layer side, thereby preventing multi-reflected light or stray light from occurring. Therefore, it is possible to reduce the effect of light on the channel region 1a'. A film may be formed of a metal or a barrier metal, which has lower reflectivity than that of the Al film constituting the main body of the data line 6a, on the surface of the data line 6a opposite to the channel region 1a', that is, the surface of the data line 6a on the lower layer side. As a metal or a barrier metal having reflectivity lower than that of the Al film, chrome (Cr), titanium (Ti), titanium nitride (TiN), tungsten (W), and so on can be used.

A relay layer 600 is formed as the same film as the data line 6a. The relay layer 600 and the data line 6a are formed so as to be separate from each other as shown in FIG. 4. Further, the relay layer 600 is electrically connected to the heavily doped drain region 1e of the TFT 30 through a contact hole 83 passing through the first interlayer insulating film 41.

The first interlayer insulating film 41 is formed of, for example, NSG (non-silicon glass). Besides, the first interlayer insulating film 41 can be formed of silicate glass, including PSG (phosphorus silicate glass), BSG (boron silicate glass), BPSG (boron phosphorous silicate glass), and the like, silicon nitride, silicon oxide, or the like.

Construction of Fourth Layer Including Storage Capacitor

The fourth layer includes the storage capacitors 70. The storage capacitor 70 is constructed so that a capacitor electrode 300 and a lower electrode 71 are opposite to each other with a dielectric film 75 interposed therebetween. Here, in an exemplary embodiment of the invention, the capacitor electrode 300 is an example of a "fixed-potential-side electrode" and the lower electrode 71 is an example of a "pixel-potential-side electrode." The capacitor electrode 300 includes an extending portion 300a that extends in the scanning-line direction and the lower electrode 71 includes a protruding portion 71a that protrudes beyond an edge of the capacitor electrode 300 in the scanning-line direction, as illustrated in FIGS. 5 and 6. The protruding portion 71a of the lower electrode 71 is electrically connected to the relay layer 600 by a contact hole 84 passing through the second interlayer insulating film 42.

The capacitor electrode 300 or the lower electrode 71 is an example of the "first conductive light-shielding film" according to an exemplary embodiment of the invention, and is formed of, for example, elemental metal, an alloy, metal silicide, poly-silicide including at least one of the high-melting-point metals, such as titanium (Ti), chromium (Cr), tungsten (W), tantalum (Ta), and molybdenum (Mo), or laminates thereof, preferably, tungsten silicide. Therefore, the channel region 1a' of the TFT 30 can be reliably shielded from incident light from the upper layer side by the storage capacitor 70 that can be disposed on the data line 6a so as to be close to the channel region 1a' with the interlayer insulating film 42 interposed therebetween.

Further, the capacitor electrode 300 is formed on the TFT array substrate 10 so as to be smaller than the lower electrode 71 in plan view, as shown in FIGS. 5 and 7 (refer to circles C1 and C2 in FIG. 7). In other words, since the capacitor electrode 300 is not formed in the vicinity of the lower electrode 71 so as to be opposite thereto with the dielectric film 75, it is possible to reduce the possibility of both electrodes being short-circuited in the vicinity of the edge due to inferior manufacturing or the possibility of defects occurring due to a high concentration of an electric field.

As in the embodiment shown in FIG. 8, a tapered portion may be provided at the edge of the lower electrode 71 opposite to the capacitor electrode 300 with the dielectric film 75 interposed therebetween (see a circle C2 in FIG. 8). This makes a gap between the lower electrode 71 and the capacitor electrode 300 in the vicinity of the edge larger as compared to when a tapered position is not provided. Therefore, even when the capacitor electrode 300 is formed in a region protruding from the lower electrode 71 on the TFT array substrate 10 in plan view, it is possible to reduce the possibility of both electrodes being short-circuited in the vicinity of the edge due to inferior manufacturing or the possibility of defects occurring due to a high concentration of an electric field.

As shown in FIG. 5, the dielectric film 75 is formed in a non-opening region located in a gap between opening regions of individual pixels on the TFT array substrate 10 in plan view. In other words, the dielectric film is rarely formed in the opening regions. For this reason, even if the dielectric film 75 is an opaque film, it dose not reduce the transmittance in the opening region. Therefore, the dielectric film 75 is composed of, for example, a silicon nitride film having a high dielectric constant regardless of transmittance. The dielectric film 75 can also function as a film for preventing water or moisture, thereby improving water resistance or moisture resistance. The dielectric film may include a monolayer or multiplayer film made of, for example, hafnium oxide ($HfO_2$), alumina ($Al_2O_3$), or titanium oxide ($Ta_2O_5$), as well as a silicon nitride film.

The second interlayer insulating film 42 is formed of, for example, NSG. In addition, the second interlayer insulating film 42 may be formed of silicate glass such as PSG, BSG, BPSG, and the like, silicon nitride, silicon oxide, or the like. A surface of the second interlayer insulating film 42 is planarized by a chemical mechanical polishing (CMP) process or the like poloshing process, a spincoat process, a process of filling up concaves, or the like. This makes unevenness due to various elements provided under the second interlayer insulating film be removed such that the surface of the second interlayer insulating film 42 is planarized. Therefore, it is possible to reduce the possibility that declination in the alignment state of the liquid crystal layer 50 interposed between the TFT array substrate 10 and the counter substrate 20 occurs, resulting in a high-definition display. Further, such a planarizing process may be performed on surfaces of other interlayer insulating films.

Construction of Fifth Layer Including Pixel Electrode

The third interlayer insulating film 43 is formed on the entire surface of the fourth layer and the pixel electrodes 9a are formed thereon as the fifth layer. The third interlayer insulating film 43 is formed of, for example, NSG. The third interlayer insulating film 43 may be formed of silicate glass such as PSG, BSG, BPSG, and the like, silicon nitride, silicon oxide, or the like. A surface of the third interlayer insulating film 43 is planarized by CMP, similarly to the second interlayer insulating film 42.

Each pixel electrode 9a (contoured by a dashed line 9a' in FIG. 5) is disposed in each of the pixel regions divided in the horizontal and vertical directions, and the data lines 6a and the scanning lines 11a are arranged in a lattice shape within the boundaries of the pixel regions (see FIGS. 4 and 5). Further, the pixel electrode 9a is composed of a transparent conductive film made of, for example, ITO (Indium Tin Oxide).

The pixel electrode 9a is electrically connected to the protruding portion 71a of the lower electrode 71 through the contact hole 85 passing through the interlayer insulating film 43 (see FIG. 7). In other words, the potential of the lower electrode 71 is equal to the potential of the pixel electrode. In particular, the potential of the capacitor electrode 300, serving as a conductive film, immediately below the pixel electrode 9a is fixed. For this reason, even though the storage capacitor 70 is disposed on the TFT array substrate 10 to partially overlap the pixel electrode 9a adjacent thereto in plan view (see FIGS. 5 and 7), the electrical effect of the adjacent pixel electrode 9a and the lower electrode 71 on each other can be blocked by the presence of the capacitor electrode 300 having a fixed potential. Therefore, it is possible to prevent electrical interference from occurring between adjacent pixel electrodes 9a.

As described above, the protruding portion 71a of the lower electrode 71 is electrically connected to the relay layer 600 through the contact hole 84 and the relay layer 600 is electrically connected to the heavily doped drain region 1e of the TFT 30 through the contact hole 83. In other words, the pixel electrode 9a is connected to the heavily doped drain region 1e of the TFT 30 by the connection between the relay layer 600 and the protruding portion 71a of the lower electrode 71. Therefore, it is possible to avoid a situation in which the interlayer distance between the pixel electrode and the drain is too long to connect them to each other through one contact hole. Further, the laminated structure and the manufacturing process can be simplified.

On the pixel electrode 9a, an alignment film 16, subjected to a predetermined alignment process such as a rubbing process, is provided.

The above is the construction of the pixel part on the side of the TFT array substrate 10 in accordance with an exemplary embodiment of the invention.

A counter electrode 21 is provided over the entire surface of the counter substrate 20 opposite to the TFT array substrate, and an alignment film 22 is provided thereon (below the counter electrode 21 in FIG. 7). The counter electrode 21 is composed of a transparent conductive film such as an ITO film, similarly to the pixel electrode 9a. Further, in order to prevent light leak current from occurring in the TFT 30, a light-shielding film 23 is provided between the counter substrate 20 and the counter electrode 21 so as to cover at least a region facing the TFT 30.

The liquid crystal layer 50 is provided between the TFT array substrate 10 and the counter substrate 20 constructed in accordance with the above-mentioned exemplary embodiment. The liquid crystal layer 50 is formed by injecting liquid crystal into a space, which is formed by sealing the peripheral edges of the substrates 10 and 20 with a sealing material. In a state in which an electric field is not applied between the pixel electrode 9a and the counter electrode 21, the liquid crystal layer 50 has a predetermined alignment state by the alignment films 16 and 22 on which an alignment process, such as a rubbing process, is performed.

The above-mentioned exemplary construction of the pixel part is common to individual pixel parts as shown in FIGS. 4 and 5. In the image display region 10a (see FIG. 1), the pixel parts having the above-mentioned construction are formed at predetermined intervals. The driving circuits, such as the scanning line driving circuits 104 and the data line driving circuit 101, are formed in the peripheral region of the image display region 10a as illustrated with reference to FIGS. 1 and 2.

Manufacturing Method

Figure 9:
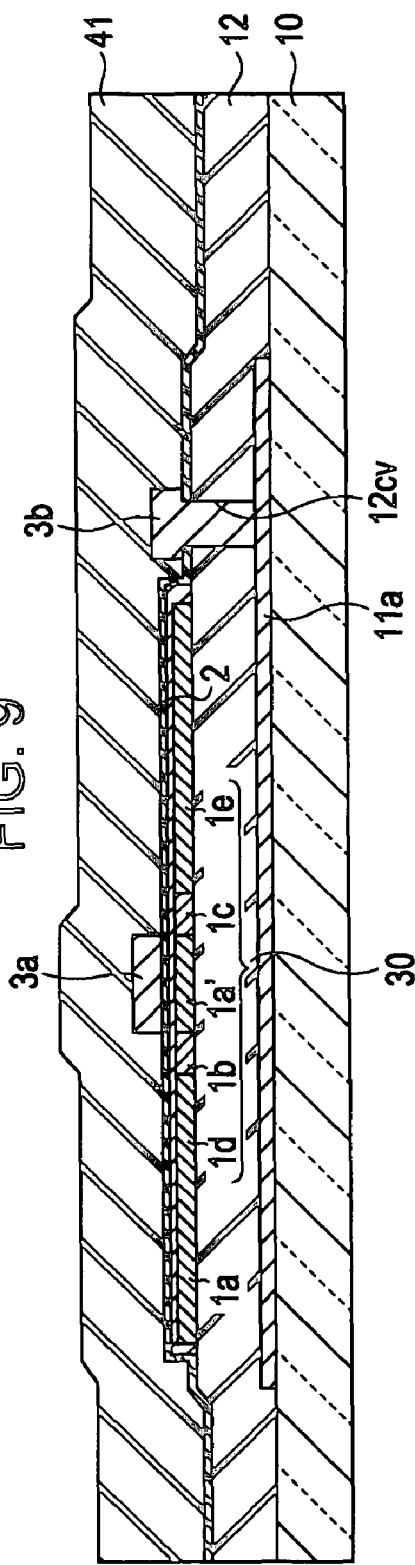
FIG. 9 is a cross-sectional view showing a first exemplary process of manufacturing the liquid crystal device according to the first embodiment of the invention.

Next, a method of manufacturing the electro-optical device, in accordance with an exemplary embodiment of the invention, will be described with reference to FIGS. 9 to 13. FIGS. 9 and 13 sequentially illustrate the laminated structure of the electro-optical device in the with reference to the cross-sectional view of FIG. 7. Hereinafter, the processes of forming the scanning lines, the TFTs, the data lines, the storage capacitors, and the pixel electrodes according to this embodiment will be described.

First, as shown in FIG. 9, individual layer constructions from the scanning lines 11a to the first interlayer insulating film 41 are laminated on the TFT array substrate 10. At this time, the TFTs 30 are formed in regions corresponding to the intersections of the scanning lines 11a and the data lines 6a to be formed later. In each process, a general semiconductor integration technique can be used. Further, after the formation of the first interlayer insulating film 41, the surface of the first interlayer insulating film may be planarized by a CMP process or the like.

Figure 10:
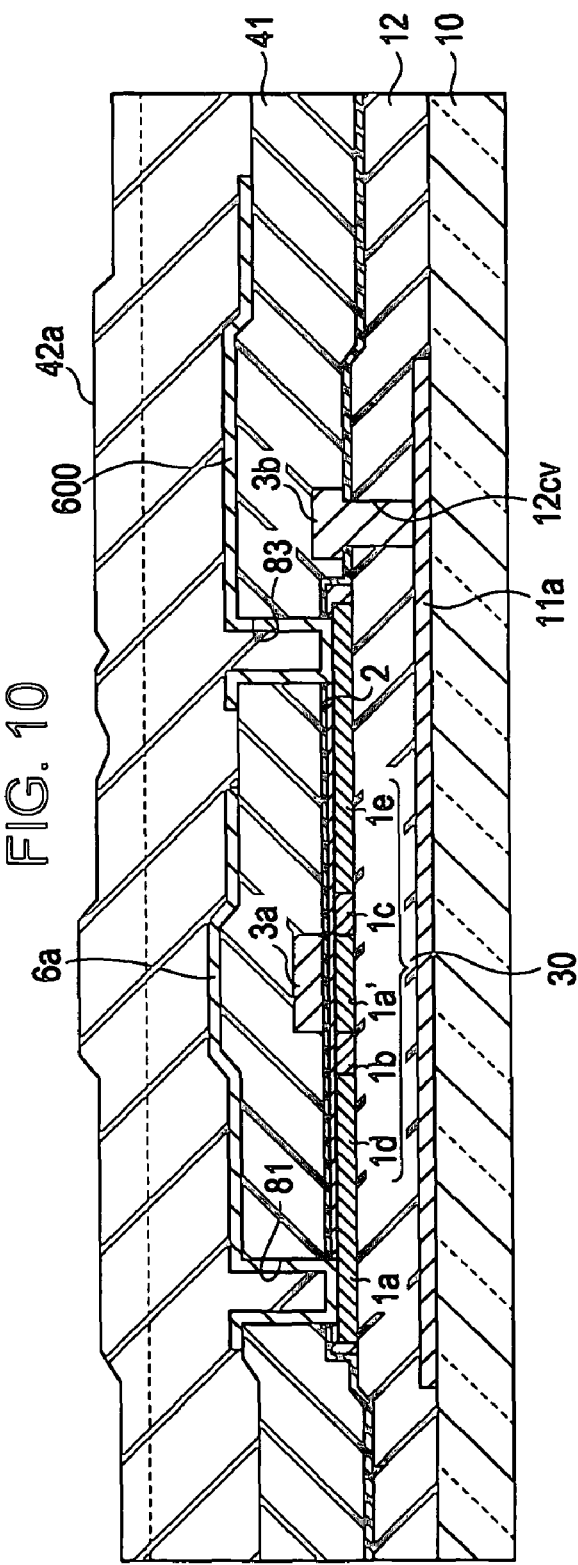
FIG. 10 is a cross-sectional view showing a second exemplary process of manufacturing the liquid crystal device according to the first embodiment of the invention.

Next, in the exemplary process shown in FIG. 10, the contact hole 81 and the contact hole 83 are formed to have depths so as to reach the heavily doped source region 1d and the heavily doped drain region 1e, respectively, by performing etching at predetermined locations on the surface of the first interlayer insulating film 41. Subsequently, the data line 6a and the relay layer 600 are formed by laminating conductive light-shielding films in a predetermined pattern. The data line 6a is formed to partially cover the channel region 1a' of the TFT and is connected to the heavily doped source region 1d by the contact hole 81. Also, in another exemplary embodiment of the invention, a conductive film having lower reflectance than that of the conductive film that is made of Al or the like and constitutes the main body of the data line 6a may be formed on the side of the data line 6a opposite to the channel region 1a' before forming the data line 6a. The relay layer 600 is connected to the heavily doped drain region 1e by the contact hole 83. Next, a precursor film 42a of the second interlayer insulating film 42 is formed on the entire surface of the TFT array substrate 10. Unevenness occurs in the surface of the precursor film 42a due to the TFTs 30, the data lines 6a, the contact holes 81 and 83, and so forth. For this reason, the precursor film 42a is formed to have a large thickness and is then removed by a CMP process to the position shown by the dashed line in FIG. 10 so that the surface is planarized. In this way, the second interlayer insulating film 42 is obtained.

Figure 11:
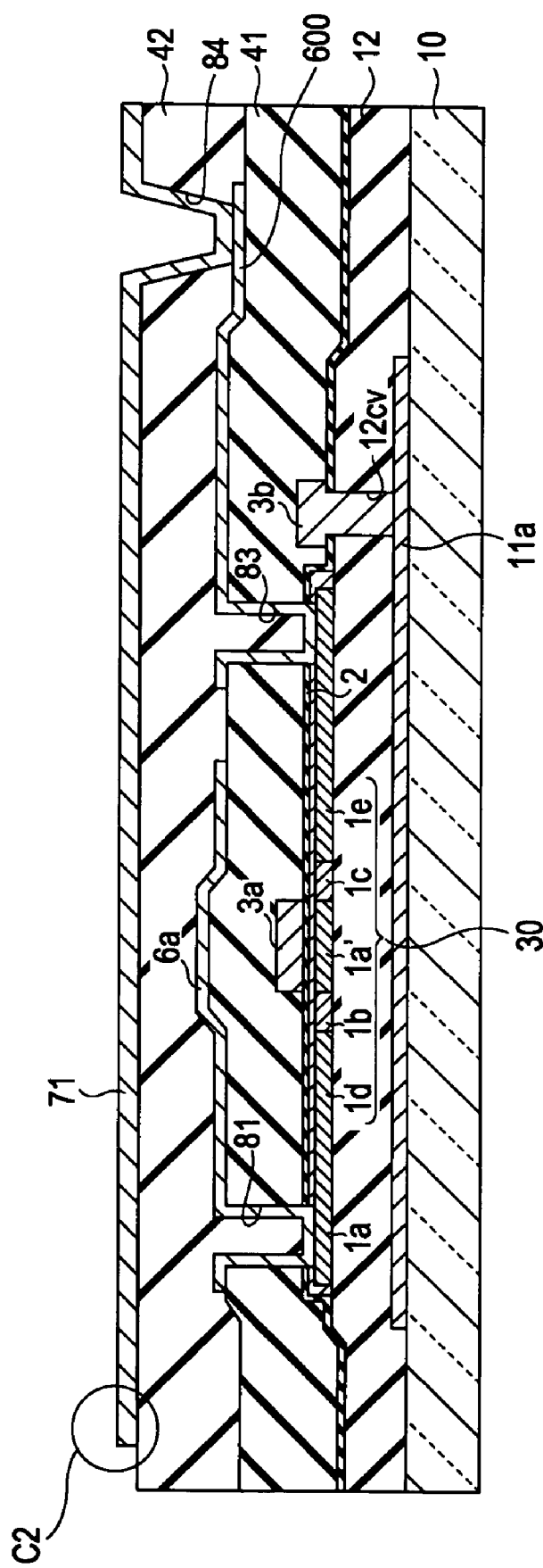
FIG. 11 is a cross-sectional view showing a third exemplary process of manufacturing the liquid crystal device according to the first embodiment of the invention.

Next, in the exemplary process shown in FIG. 11, the contact hole 84 is formed so as to have a depth reaching the relay layer 600 by performing etching at a predetermined position on the surface of the second interlayer insulating film 42. Subsequently, the lower electrode 71 is formed by laminating a conductive light-shielding film in a predetermined pattern. The lower electrode 71 is formed so as to include a region opposite to the channel region 1a' of the TFT 30 and is connected to the relay layer 600 by the contact hole 84. A tapered portion may be provided at a predetermined edge (see a circle C2 in FIG. 11) of the lower electrode 71 by wet etching. When such a tapered portion is formed, in the next process and so on, it is possible to reduce a possibility that defects occur in the vicinity of the edge of the lower electrode 71 or defects occur due to high concentration of an electric field. Further, at the time of forming the tapered portion, plasma etching or $O_2$ cleaning may be used in addition to or instead of wet etching, thereby relatively forming the tapered portion simply.

Figure 12:
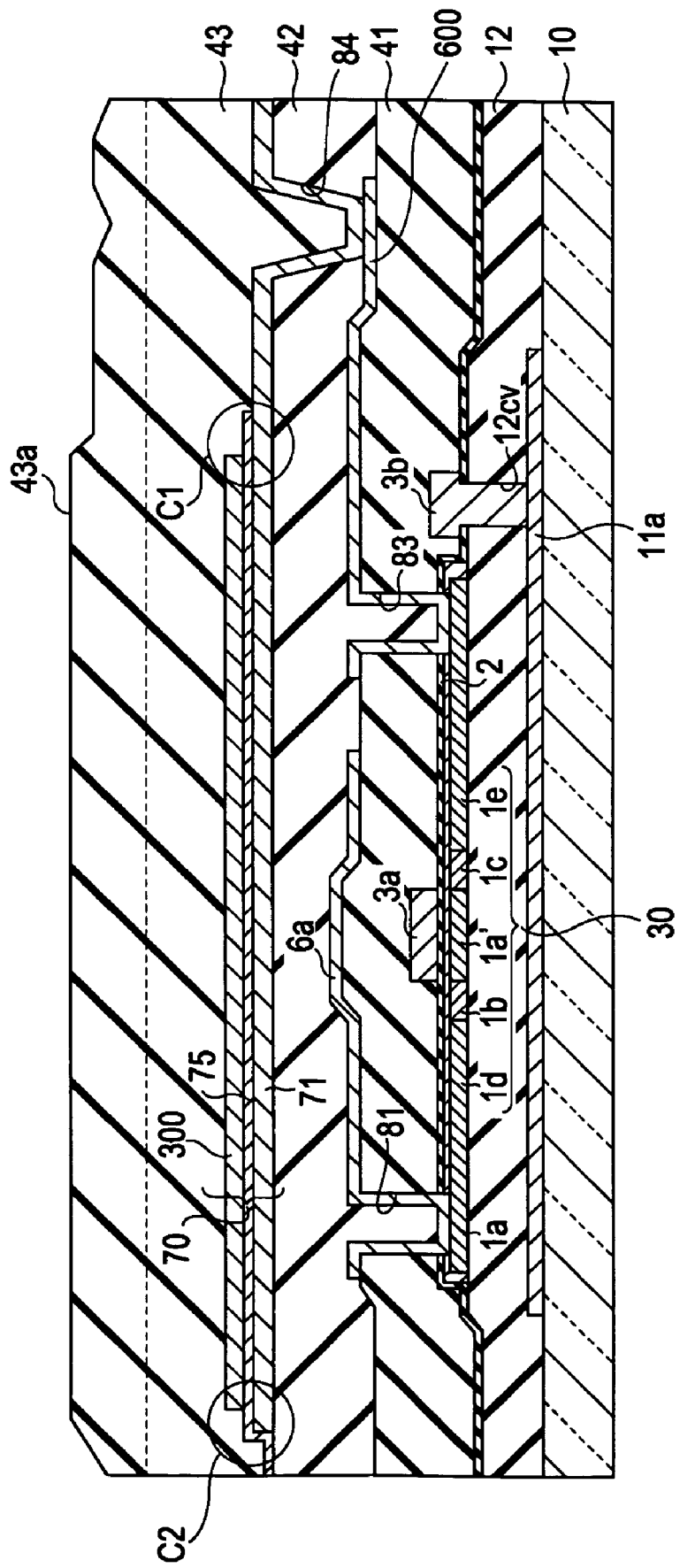
FIG. 12 is a cross-sectional view showing a fourth exemplary process of manufacturing the liquid crystal device according to the first embodiment of the invention.
Figure 13:
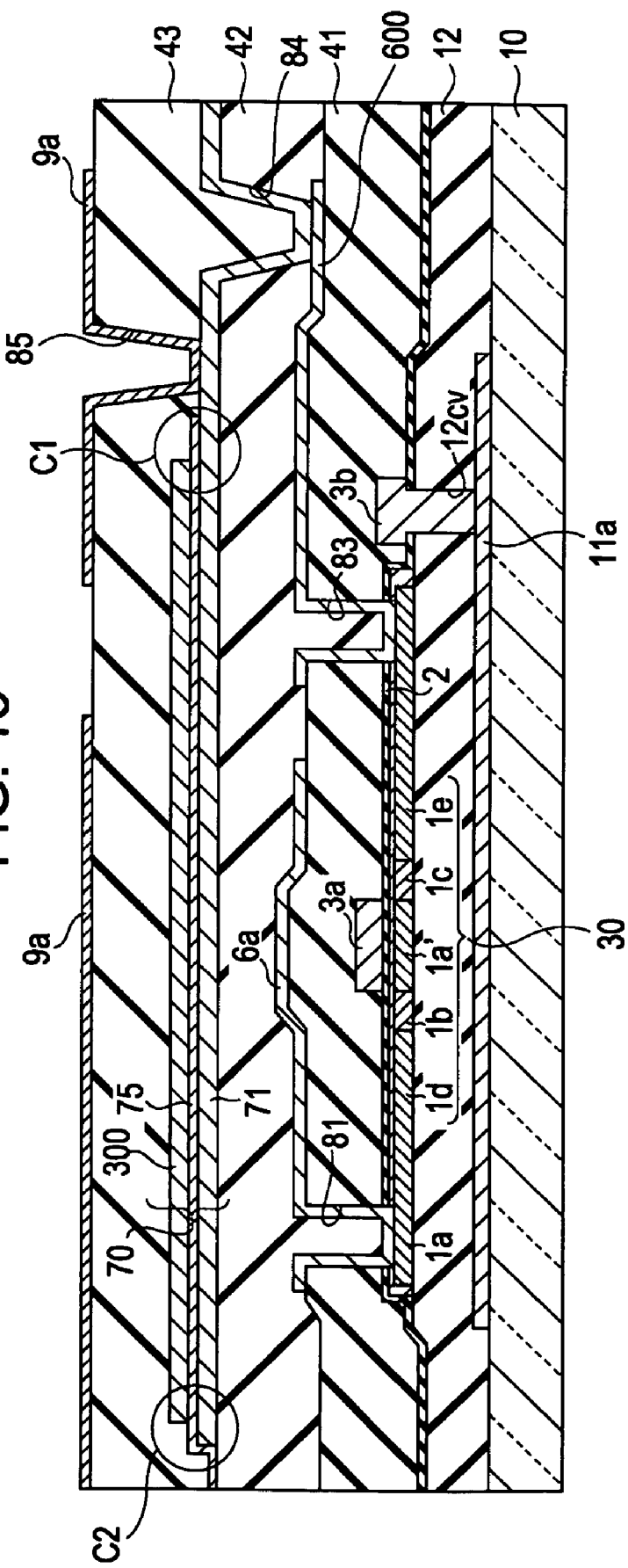
FIG. 13 is a cross-sectional view showing a fifth exemplary process of manufacturing the liquid crystal device according to the first embodiment of the invention.

Next, in the exemplary process shown in FIG. 12, the dielectric film 75 is formed in the non-opening region on the TFT array substrate 10. Subsequently, the capacitor electrode 300 is formed by laminating a conductive light-shielding film in a predetermined region including the region opposite to the channel region 1a'. At this time, the capacitor electrode 300 is formed to be smaller than the lower electrode 71 on the TFT array substrate 10 in plan view (see circuits C1 and C2 in FIG. 11). As a result, in the next processes, it is possible to reduce the possibility that defects occur in the vicinity of the edge of the lower electrode 71 or defects occur due to high concentration of an electric field. Next, a precursor film 43a of the third interlayer insulating film 43 is formed on the entire surface of the TFT array substrate 10. Unevenness occurs in the surface of the precursor film 43a due to the storage capacitor 70 or the contact hole 84. For this reason, the precursor film 43a is formed to have a large thickness and is then removed by, for example, a CMP process to the position shown by the dashed line in FIG. 12 such that the surface is planarized. In this way, the third interlayer insulating film 43 is obtained.

Next, in the exemplary process shown in FIG. 13, the contact hole 85 is formed to have a depth reaching the extruding portion of the lower electrode 71 by performing etching at a predetermined position on the surface of the third interlayer insulating film 43. Subsequently, the pixel electrode 9a is formed at a predetermined position of the surface of the third interlayer insulating film 43. At this time, while the pixel electrode 9a is formed in the contact hole 85, the coverage is sufficient because the diameter of the contact hole 85 is large.

According to the exemplary methods of manufacturing a liquid crystal device as described above, it is possible to manufacture a liquid crystal device according to an embodiment of this invention. In particular, since the laminated structure on the TFT array substrate 10 is relatively simple, it is possible to simplify the manufacturing processes and to increase the yield.

Electronic Apparatus

Next, in accordance with the invention, exemplary electronic apparatuses which use the liquid crystal device set forth above will now be described.

Figure 14:
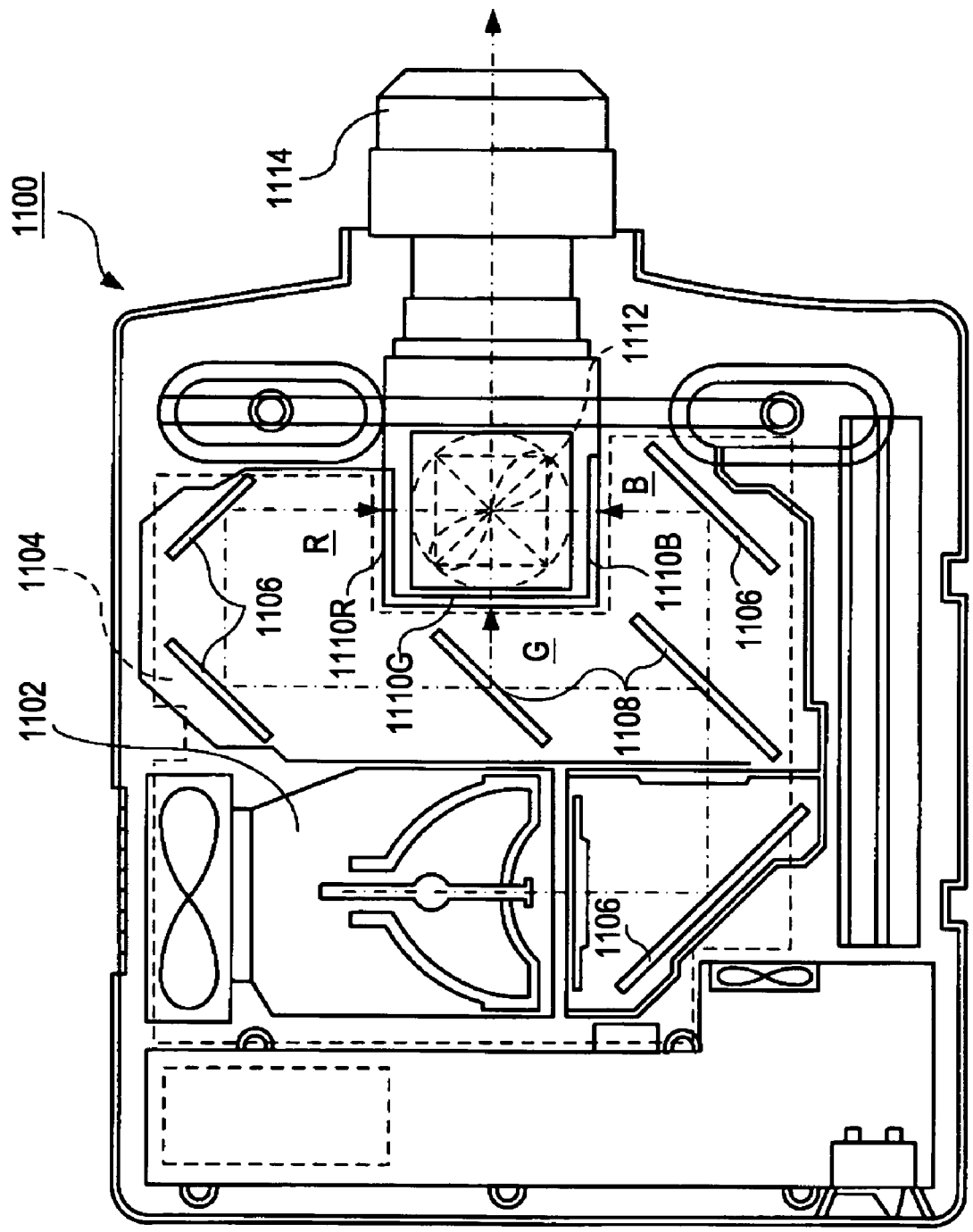
FIG. 14 is a plan view showing the construction of a projector as an electronic apparatus to which an electro-optical device is applied in accordance with another exemplary embodiment of the invention.

First, a projector using the liquid crystal device as a light valve will be described. FIG. 14 is a plan view showing an exemplary construction of a projector. As shown in FIG. 14, a lamp unit 1102, which is a white light source, such as a halogen lamp is provided inside the projector 1100. Projecting light emitted from the lamp unit 1102 is divided into light components of three primary colors of R, G, and B by means of four mirrors 1106 and two dichroic mirrors 1108 which are arranged in a light guide 1104, and the divided light components are incident on liquid crystal panels 1110R, 1110B, and 1110G which are light valves corresponding to the respective primary colors.

The constructions of the liquid crystal panels 1110R, 1110B, and 1110G are the same as that of the above-mentioned liquid crystal device and are driven with signals of primary colors R, G, and B supplied from an image signal processing circuit, respectively. Then, the light components modulated by means of the liquid crystal devices are incident on a dichroic prism 1112 in three directions. In the dichroic prism 1112, while the light components of R and B are refracted by 90 degrees, the light component of G goes right on. Accordingly, images of the respective colors are combined and pass through a projecting lens 1114, and thus a color image is projected on a screen or the like.

Here, in display images by the liquid crystal panels 1110R, 1110B, and 1110G, the display image by the liquid crystal panel 1110G is required to be mirror-inversed with respect to the display images by the liquid crystal panels 1110R and 1110B.

Further, since the light components corresponding to three primary colors of R, G, and B are incident on the liquid crystal panel 1110R, 1110B, and 1110G by the dichroic mirrors 1108, it is unnecessary to provide a color filter.

Figure 15:
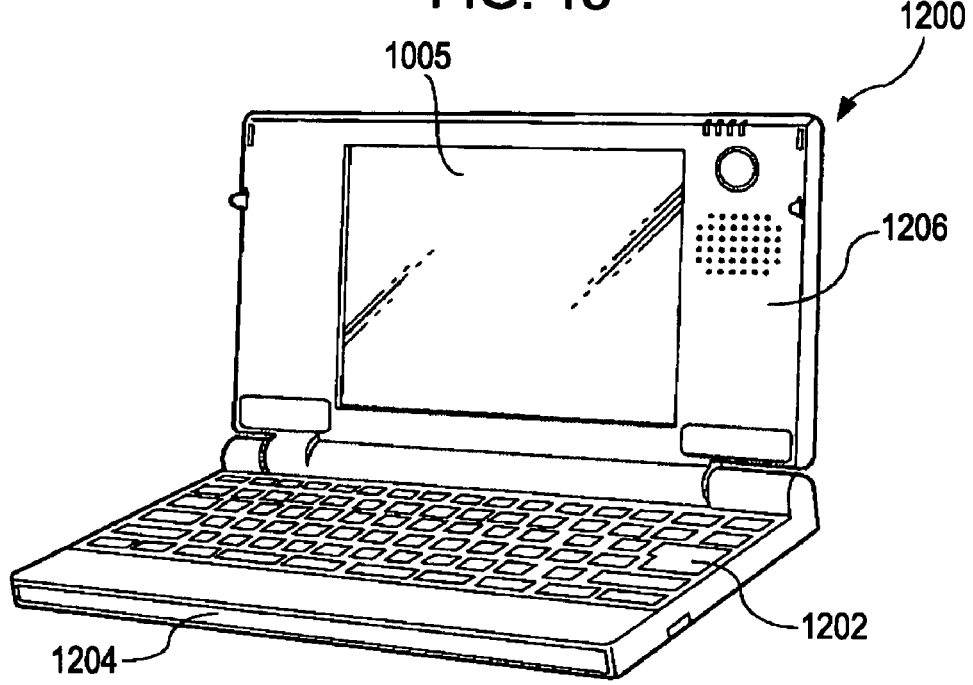
FIG. 15 is a plan view showing the construction of a personal computer as an electronic apparatus to which the electro-optical device is applied in accordance with yet another exemplary embodiment of the invention.

Next, in accordance with the invention, an example in which the liquid crystal device is applied to a mobile personal computer will be now described. FIG. 15 is a perspective view showing the construction of the personal computer. In FIG. 15, the personal computer 1200 includes a main body portion 1204 provided with a keyboard 1202 and a liquid crystal display unit 1206. The liquid crystal display unit 1206 is configured by adding a backlight to a rear surface of a liquid crystal device 1005.

Figure 16:
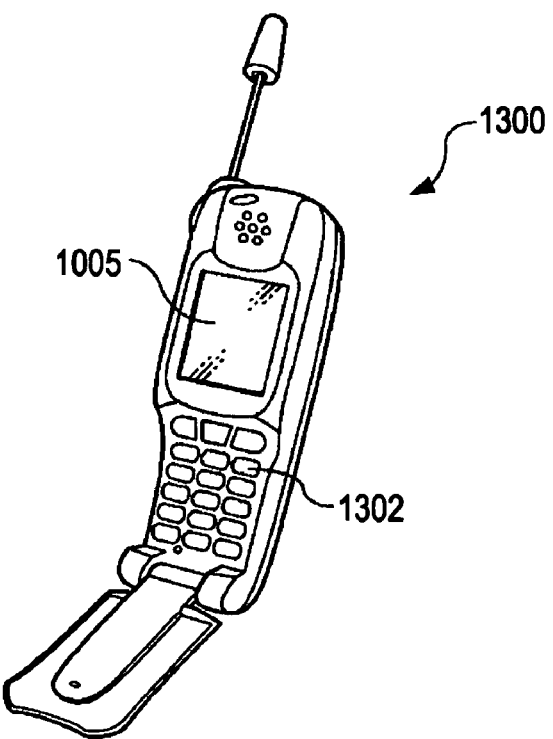
FIG. 16 is a plan view showing the construction of a cellular phone as an electronic apparatus to which the electro-optical device is applied in accordance with still another exemplary embodiment of the invention.

Next, in accordance with the invention, an example in which the liquid crystal device is applied to a cellular phone will now be described. FIG. 16 is a perspective view showing the construction of the cellular phone. In FIG. 16, the cellular phone 1300 is provided with a plurality of operating buttons 1302 and a reflective liquid crystal device 1005. If necessary, on a front surface of the reflective liquid crystal device 1005, a front light may be provided.

The electronic apparatuses to which the liquid crystal display device according to the present invention can be applied include, for example, a liquid crystal TV set, a viewfinder-type video tape recorder, a monitor-direct-view-type video tape recorder, a car navigation apparatus, a pager, an electronic organizer, a calculator, a word processor, a work station, a video phone, a POS terminal, and an apparatus having a touch panel, as well as the apparatuses described above with reference to FIGS. 14 to 16.

The invention can be applied to a reflective liquid crystal device (LCOS) in which elements are formed on a silicon substrate, a plasma display (PDP), a field emission display (FED, SED), an organic EL display, etc, in addition to the above-mentioned liquid crystal devices.

The present invention is not limited to the above-mentioned exemplary embodiments, but can be appropriately modified without departing from the subject matter and spirit of the invention read in the claims and specification. An electro-optical device, an electronic apparatus having the electro-optical device, and a method of manufacturing the electro-optical device, also fall within the technical scope of the present invention.

What is claimed is:

1. An electro-optical device comprising:
a substrate;
scanning lines extending in a scanning-line direction;
data lines extending in a data-line direction that intersects the scanning-line direction, the data lines including a first conductive light-shielding film;
thin film transistors disposed below the data lines and above the substrate, at least one of the thin film transistors having a channel region, a source region, and a drain region;
storage capacitors which are disposed over the data lines in at least a region opposite to the channel region of the thin film transistor in plan view, each storage capacitor having a pixel-potential-side electrode, a dielectric film, and a fixed-potential-side electrode that have been formed sequentially;
pixel electrodes that are disposed over the storage capacitors so as to correspond to the data lines and the scanning lines in plan view, the pixel electrodes being electrically connected to the pixel-potential-side electrodes and the thin film transistors; and
a second conductive light-shielding film that is formed by the fixed-potential-side electrodes and the pixel-potential-side electrodes, each of the fixed-potential-side electrodes being extended in the data-line direction and having an extending portion that extends to an endmost edge in the scanning-line direction, each of the pixel-potential-side electrodes being extended in the data-line direction and in the scanning-line direction and having a protruding portion that protrudes beyond the endmost edge of the fixed-potential-side electrode in the scanning-line direction, the protruding portion being in direct electrical and physical contact with the pixel electrode.

2. The electro-optical device according to claim 1,
wherein the thin film transistors are disposed so as to correspond to the intersections of the data lines and the scanning lines in plan view such that at least portions of the channel regions of the thin film transistors are covered by the data lines, and
each of the data lines includes a second conductive light-shielding film.

3. The electro-optical device according to claim 1,
wherein each of the scanning lines is disposed on the substrate below the thin film transistors in at least a region opposite to the channel region of the thin film transistor in plan view, each scanning line being electrically connected to a gate of the thin film transistor through a contact hole, and including a third conductive light-shielding film.

4. The electro-optical device according to claim 1,
wherein a planarized interlayer insulating film is laminated on at least one of the group of layers consisting of the scanning lines, the thin film transistors, the data lines, the storage capacitors, and pixel electrodes.

5. The electro-optical device according to claim 1,
wherein the dielectric film is formed in a non-opening region positioned in a gap between an opening region of each pixel on the substrate in plan view.

6. The electro-optical device according to claim 1,
wherein the dielectric film is formed in a region that does not include an opening region of each pixel on the substrate in plan view.

7. The electro-optical device according to claim 1,
wherein a surface of each of the data lines facing the channel regions has a first reflectivity and a main body of each of the data lines has a second reflectivity;
wherein the first reflectivity is lower than the second reflectivity.

8. The electro-optical device according to claim 1,
wherein the pixel-potential-side electrode has an edge with a tapered shape, and the pixel-potential-side electrode is opposite to at least the fixed-potential-side electrode with the dielectric film formed therebetween.

9. The electro-optical device according to claim 1,
wherein the fixed-potential-side electrode is formed in at least a region where the pixel-potential-side electrode is formed in plan view.

10. The electro-optical device according to claim 1, further comprising:
a relay layer comprising a conductive film and being formed in the same layer as the data line, the relay layer performing relay connection between the pixel-potential-side electrode and a drain of the thin film transistor.

11. The electro-optical device according to claim 10,
wherein the pixel electrodes are electrically connected to the relay layer by the protruding portion of the pixel-potential-side electrodes.

12. An electronic apparatus comprising the electro-optical device according to claim 1.

13. An electro-optical device comprising:
a substrate;
scanning lines extending in a scanning-line direction;
data lines extending in a data-line direction that intersects the scanning-line direction, the data lines including a first conductive light-shielding film;
thin film transistors disposed below the data lines and above the substrate, wherein at least one of the thin film transistors has a channel region, a source region, and a drain region, at least a portion of the channel region being covered by the data lines;
storage capacitors which are disposed over the data lines in at least a region opposite to a channel region of the thin film transistor in plan view, each storage capacitor having a pixel-potential-side electrode, a dielectric film, and a fixed-potential-side electrode that have been formed sequentially; and
pixel electrodes that are disposed over the storage capacitors, the pixel electrodes being electrically connected to the pixel-potential-side electrodes and the thin film transistors;
wherein each of the fixed-potential-side electrodes is extended in the data-line direction and has an extending portion that extends to an endmost edge in the scanning-line direction; and
wherein each of the pixel-potential-side electrodes is extended in the data-line direction and in the scanning-line direction and has a protruding portion that protrudes beyond the endmost edge of the fixed-potential-side electrode in the scanning-line direction, the protruding portion being in direct electrical and physical contact with the pixel electrode.

* * * * *